United States Patent [19]
Kilby

[11] 3,835,530

[45] Sept. 17, 1974

[54] METHOD OF MAKING SEMICONDUCTOR DEVICES

[75] Inventor: Jack S. Kilby, Dallas, Tex.

[73] Assignee: Texas Instruments Incorporated, Dallas, Tex.

[22] Filed: Sept. 22, 1971

[21] Appl. No.: 182,875

Related U.S. Application Data

[60] Division of Ser. No. 645,539, June 5, 1967, Pat. No. 3,643,232, which is a continuation of Ser. No. 420,031, Dec. 21, 1964, abandoned.

[52] U.S. Cl. ........................ 29/574, 29/577, 29/628
[51] Int. Cl. ........................ B01j 17/00
[58] Field of Search ........ 29/574, 577, 577 IC, 628, 29/578

[56] References Cited

UNITED STATES PATENTS

| | | | |
|---|---|---|---|
| 3,189,978 | 6/1965 | Stetson | 29/628 |
| 3,199,002 | 8/1965 | Martin | 29/577 |
| 3,333,326 | 8/1967 | Thomas | 29/577 |
| 3,366,519 | 1/1968 | Pritchard | 317/234 |
| 3,390,012 | 6/1968 | Haberecht | 29/577 |
| 3,547,604 | 12/1970 | Davis et al. | 29/577 |

*Primary Examiner*—Roy Lake
*Assistant Examiner*—W. Tupman
*Attorney, Agent, or Firm*—Hal Levine; Rene Grossman; Andy Hassell

[57] ABSTRACT

A method of manufacturing semiconductor integrated circuits in complex arrays. A large number of electronic components are formed on a wafer and interconnected to define functional elements using a first metallization level. The functional elements are tested at this point, and selected ones are connected together by a second metallization level to provide the desired system.

20 Claims, 11 Drawing Figures

METHOD OF MAKING SEMICONDUCTOR DEVICES

This application is a divisional of application Ser. No. 645,539, filed June 5, 1967 and now U.S. Pat. No. 3,643,232 which is a continuation of application Ser. No. 420,031, filed Dec. 21, 1964, now abandoned.

This invention relates to semiconductor devices and manufacturing methods therefor, and more particularly to techniques for fabricating complex electric circuitry and systems in microminiature form.

Semiconductor integrated circuits have been widely accepted for electronic systems of the type used in missile and space equipment where size, weight, power consumption, and reliability are critical factors. These integrated circuit devices ordinarily comprise minute wafers or bars of semiconductor material having a large number of circuit components formed therein, with the components being interconnected by metal film to provide the desired circuit function. Such devices ]re described in my U.S. Pat. No. 3,138,743, issued June 23, 1964. Each integrated device usually contains one circuit function, such as a flip-flop, a logic gate, or the like. The semiconductor wafers in these devices are ordinarily encapsulated in small, flat, hermetically sealed packages, as illustrated in my U.S. Pat. No. 3,072,000, issued Jan. 8, 1963, a number of such packages being mounted on a circuit board to provide a subsystem.

In electronic equipment employing integrated circuitry the point has been reached, or is fast approaching, where the reliability and cost are primarily determined by the connecting structures rather than by the semiconductor bars. Wires must be bonded from the bars to tabs leading out of the hermetically sealed packages, then these tabs must be welded or soldered to conductors on a circuit board, and the circuit boards interconnected with one another with plugboard arrangements. Each such connection ordinarily involves hand operations, uses expensive materials, and introduces breakage in manufacture. Furthermore, the reliability of a solder or weld joint, while usually considered extremely high, becomes a significant contributing factor in failures when the "mean time between failure" specified for a system is extended into the range of many thousands of hours. The intraconnections on the semiconductor bar itself are made by photographic techniques which require no individual hand operations, use infinitesimally small amounts of material, involve no violent mechanical operations such as welding or pressure bonding during manufacture, and so are vastly cheaper and more reliable than external connections.

Accordingly, based on reliability and cost considerations as well as the continued goals of reducing size and weight and increasing operating frequencies or speeds, it is desirable to increase the number of components in each integrated circuit bar, and this increases the number of electronic functions in each package, reducing the packages per system. It is presently possible to produce monocrystalline silicon slices of perhaps one inch in diameter having a hundred or more circuit functions thereon, with each circuit function containing perhaps twenty or more circuit components so that the slice includes thousands of components, i.e. transistors, resistors, etc. It can thus be visualized that entire electronic systems or subsystems could be constructed on a single semiconductor slice. Unfortunately, the manufacturing yield of good components or good circuit functions on a given slice is less than 100 percent, and this fact prevents immediate utilization of the advantages of incorporating vast quantities of circuitry in single semiconductor units.

Data taken on recent production of semiconductor integrated circuits indicates that the yield of good circuit functions per slice is fairly high, significantly above 50 percent, and this is quite economical when the slice is broken up into bars which contain only one circuit function. However, the yield when all circuit functions on an entire slice must be good is essentially zero. That is, a slice with all good units thereon is virtually never found. Thus, manufacture of semiconductor devices containing complex systems or subsystems on a single semiconductor body would be prohibitively expensive, if not impossible, using present techniques.

It is therefore the principal object of this invention to provide an economical method for manufacturing electronic systems wherein the number of semiconductor devices required is reduced to a minimum by incorporating large numbers of electronic functions or circuits into a single semiconductor body. Another object is to provide a technique for interconnecting components on a semiconductor bar whereby provision is made for use of bars containing non-functional components such as may occur in manufacturing.

In accordance with this invention, an electronic system or subsystem containing many circuits or functional elements is made by first forming a large number of circuit components in a semiconductor body, these being in excess of the number necessary to produce the desired functions, then testing the components or functional units, and finally generating on the semiconductor body a unique interconnection pattern based on the results of the testing. This pattern is preferably created by photographic techniques using a mask made by conventional manual operations, by electron beam exposure of photoresist directly upon the semiconductor body, or by other means as will be described hereinafter. The entire operations of testing and generation of the unique mask may be carried out by electromechanical data processing equipment.

Using the methods of this invention, a complex electronic system containing hundreds of circuit functions and thousands of circuit components may be formed on a single semiconductor wafer, even using present-day process or manufacturing technology, because yields of much less than 100 percent good circuit functions per slice or wafer are acceptable.

Novel features believed characteristic of the invention are set forth in the appended claims. The invention itself, however, as well as further objects and advantages thereof, will best be understood from the following detailed description of illustrative embodiments, read in conjunction with the accompanying drawing, wherein:

Figure 1:
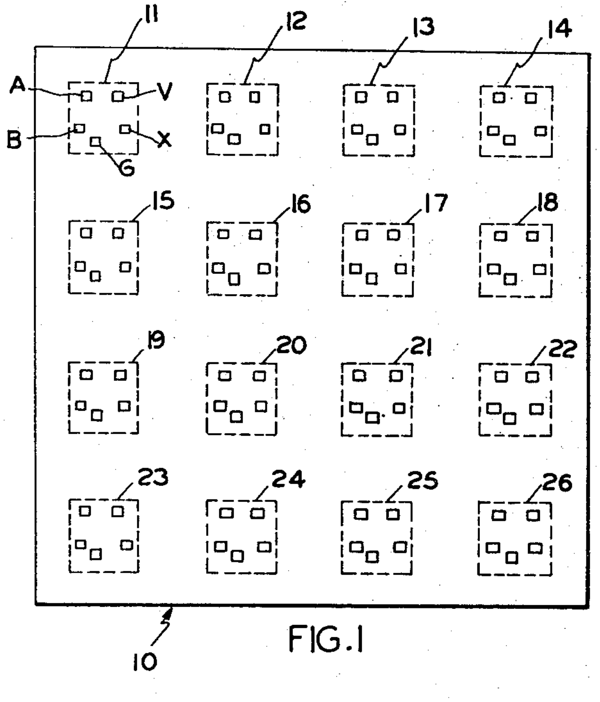
FIG. 1 is a plan view, greatly enlarged, of a semiconductor wafer containing a plurality of functional elements and adapted for use in practicing this invention.

With reference to FIGS. 1–11, an example of a way of practicing the invention will now be described. A bar or wafer 10 of semiconductor material is shown in FIG. 1 having a large number of functional elements 11–26 thereon. In this illustrative embodiment, only sixteen such functional elements are shown, but a much larger number is preferably utilized. Each of the functional elements 11–26 contains a number of transistors, resistors, capacitors or the like interconnected to form a desired electrical function. In this example, a logic function useful in digital computers is provided by each element 11–26, this function being illustrated in logic diagram form in FIG. 2. This functional element 11 comprises three AND gates 27, 28 and 29 and two inverters 30 and 31 interconnected as illustrated to provide the desired logic function. This circuit has three inputs A, B and X, and an output G, these along with a voltage supply terminal V corresponding to the five terminals seen on each functional element in FIG. 1. The manner of interconnecting these terminals to produce a logic system is the principal feature of this invention, and will be described in detail below, but first the functional element itself will be examined.

Figure 2:
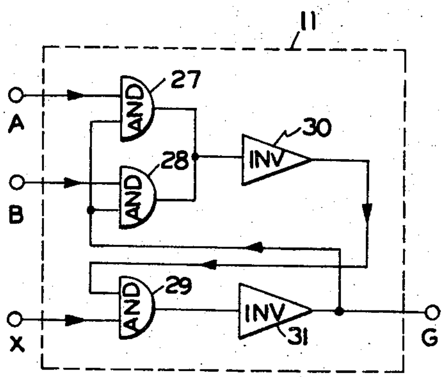
FIG. 2 is a logic diagram of a representative one of the functional elements in the wafer of FIG. 1.
Figure 3:
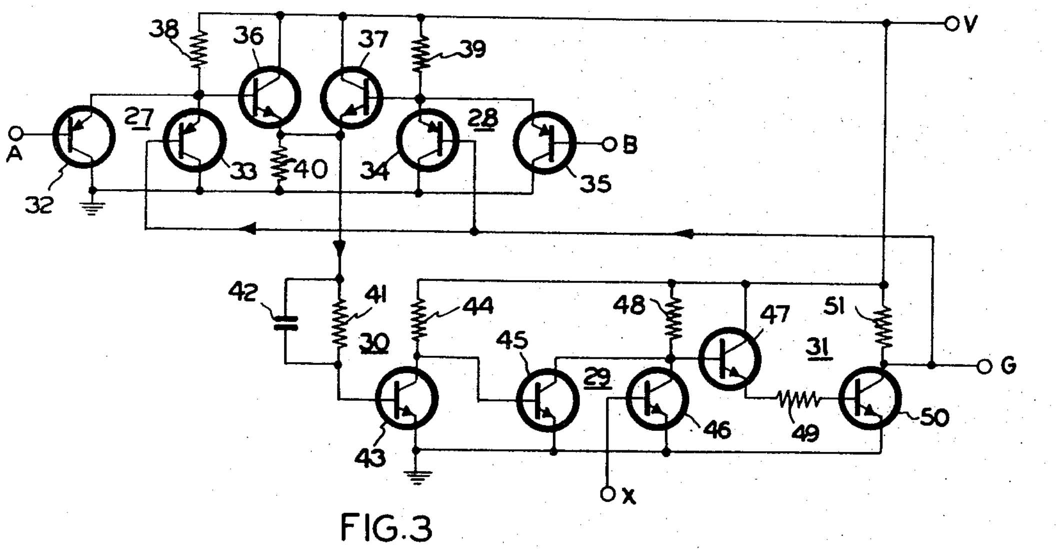
FIG. 3 is a schematic diagram of the electronic circuit in one of the functional elements in the wafer of FIG. 1, this circuit performing the logic function diagrammed in FIG. 2.

Referring now to FIG. 3, a schematic diagram corresponding to the logic diagram of FIG. 2 is illustrated. The AND gates 27 and 28 each include a pair of PNP transistors 32, 33 and 34, 35, along with NPN emitter follower output transistors 36 and 37. The terminals A and B provide inputs to the transistors 32 and 35, respectively, while the inputs to the transistors 33 and 34 are connected to the output G. The transistors 32 and 33 have a common load resistor 38, and the transistors 34 and 35 likewise share a load resistor 39. The emitter follower transistors 36 and 37 have a common load resistor 40, and the output across this resistor is connected through a resistor 41 shunted by a capacitor 42 to the base of an NPN transistor 43. This transistor along with its load resistor 44 make up the inverter 30. The output of this inverter is coupled to one input of the AND gate 29 which comprises a pair of NPN transistors 45 and 46 along with an emitter follower output transistor 47 and a load resistor 48. The other input to this gate 29 is the terminal X. The emitter of the transistor 47 is connected through a resistor 49 to the base of an NPN transistor 50 which along with its load resistor 51 provides the inverter 31. The output of this inverter is the output 6, and is also coupled back to the inputs of the transistors 33 and 34. It is noted that only one positive voltage supply is necessary for the whole circuit, this being provided by the terminal V. The electrical circuit of FIG. 3, which provides the operating characteristics of the functional element 11, is formed in the semiconductor wafer 10 by integrated circuit techniques as will be seen in FIG. 4.

Figure 4:
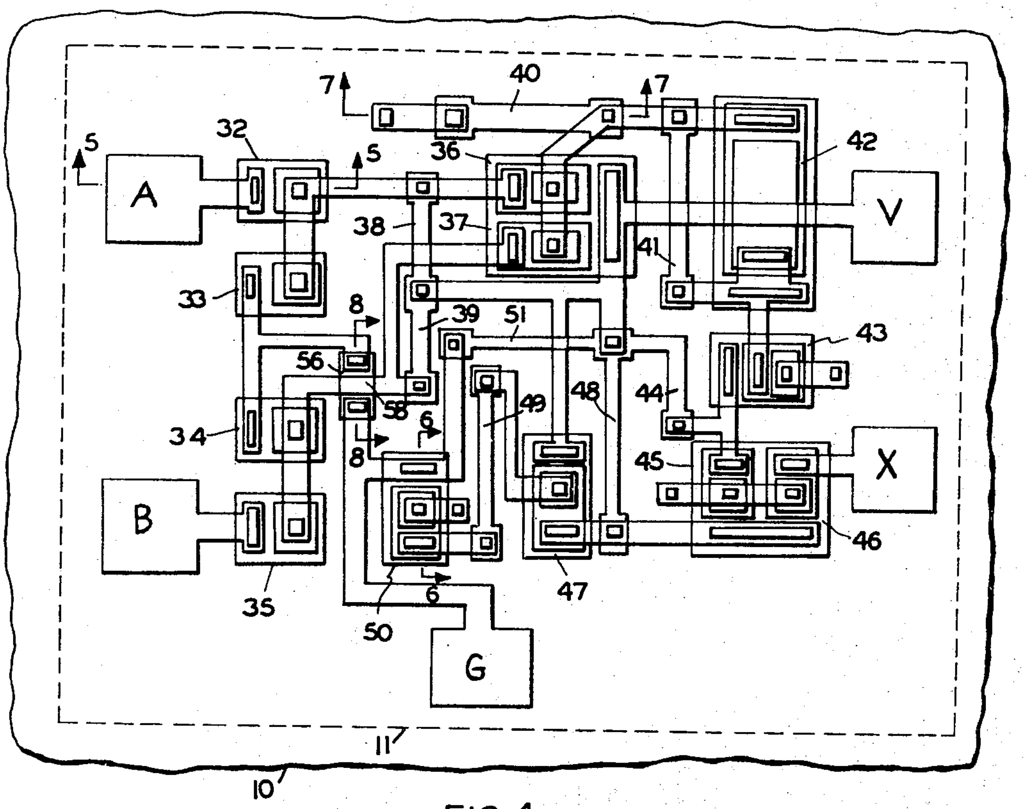
FIG. 4 is a plan view, greatly enlarged, of the layout of circuit components in one of the functional elements in the wafer of FIG. 1, these same circuit components being illustrated in schematic diagram form in FIG. 3.
Figure 6:
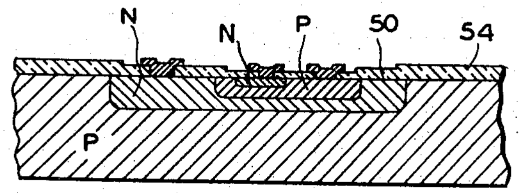
FIG. 6 is a sectional view of an NPN transistor in the element of FIG. 4, taken along the line 6—6.
Figure 5:
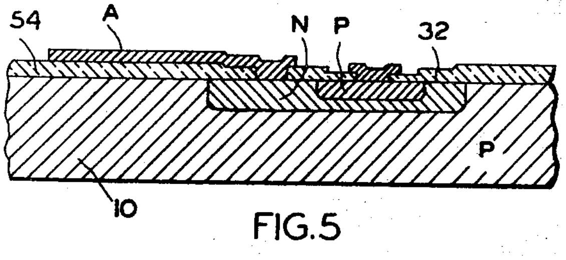
FIG. 5 is a sectional view of a PNP transistor in the functional element of FIG. 4, taken along the line 5—5.
Figure 7:
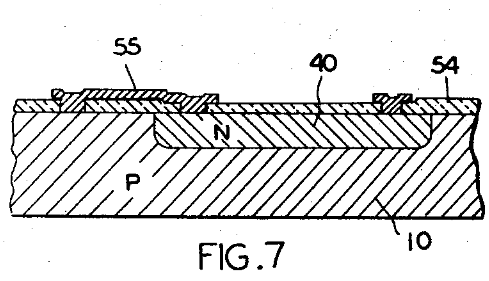
FIG. 7 is a sectional view of a resistor in the element of FIG. 4, taken along the line 7—7.
Figure 8:
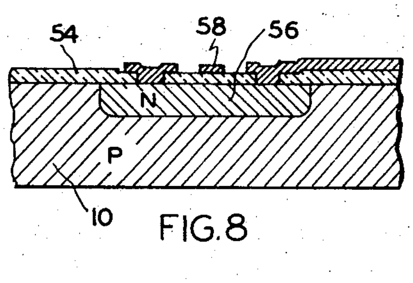
FIG. 8 is a sectional view along the line 8—8 in FIG. 4 showing a tunnel for a crossover of interconnections.

FIG. 4 shows a greatly enlarged plan view or layout of one of the functional elements on the wafer 10, all of these elements being exactly alike in this example. The extreme small size of the devices of this invention should be noted at this point. Each functional element may be only perhaps 10 to 20 mils on a side, this being barely discernible to the naked eye, and the wafer itself about 80 to 100 mils on a side. Each of the PNP transistors 32, 33, 34 and 35 is formed as in sectional view in FIG. 5 where it is seen that the wafer itself, being P-type silicon for example, provides the collector of the transistors 32, a diffused N-type region is the base region, and a diffused P-type region is the emitter. An insulating coating 54, typically silicon oxide defining a stepped configuration due to the successive diffusions using oxide masking, covers the top surface of the wafer. Metal contacts and interconnections overlie the oxide and engage the silicon surface in holes etched through at the desired contact points. Each of the NPN transistors 36, 37, 43, 45, 46, 47 and 50 is formed as seen in section in FIG. 6. The collector is an N-type diffused region, the base a P-type diffused region, and the emitter an N-type diffused region. It will be noted that the emitters of the NPN transistors 43, 45, 46 and 50 are grounded by a metal connection to the P-type substrate on wafer 10 which is common with the collectors of the PNP transistors. Each of the resistors 38, 39, 40, 41, 44, 48, 49 and 51 is formed by elongated N-type diffused regions such as the one illustrated in FIG. 7, where a metallized strip 55 which connects the left end of this resistor 40 to the grounded substrate or wafer 10 is also seen. Whenever it is necessary for a metal connecting strip to cross over another strip, a "tunnel" is used as illustrated in FIG. 8. The tunnel is a heavily doped diffused region 56 which merely acts as a good conductor, while a metal strip 58 crosses over this region but is insulated therefrom by the oxide coating 54. The capacitor 42 is of the PN junction type and consists of alternate P- and N-type regions just as the NPN transistors. In the capacitor the two N-type diffused regions are connected together and function as one plate while the P-type region intermediate these two functions as the other plate. Supply voltage is applied to the land V and is coupled by metal strips to the transistor collectors and the load resistors.

It is understood of course that the semiconductor integrated circuit shown in FIGS. 4–8 and described above is merely illustrative of one of the many forms which may be used with this invention. For example, instead of a triple-diffused structure as shown, the functional elements may be made by combinations of epitaxial growth and diffusion steps. The PN junctions used for isolation between components in the device of FIGS. 4–8 may be replaced by dielectric barriers as is known in the art. Metal film resistors and/or thin film capacitors of the type illustrated in my U.S. Pat. No. 3,138,744 may be used in place of the diffused passive components described above. Other active elements, such as junction type field-effect transistors, insulated gate field-effect transistors, thin film devices, etc. may be employed in place of the junction transistors shown. While silicon is given as an example of the semiconductor material used, other semiconductors such as germanium or the III–V compounds are equally suitable. Instead of being a monocrystalline extrinsic substrate, the wafer 10 could be polycrystalline, intrinsic or semi-insulating in character. Also, it will be understood that the logic circuit shown is merely arbitrarily chosen for illustrative purposes, and any functional elements or combination thereof could equally well employ the interconnection scheme of this invention as will be described below.

Figure 9:
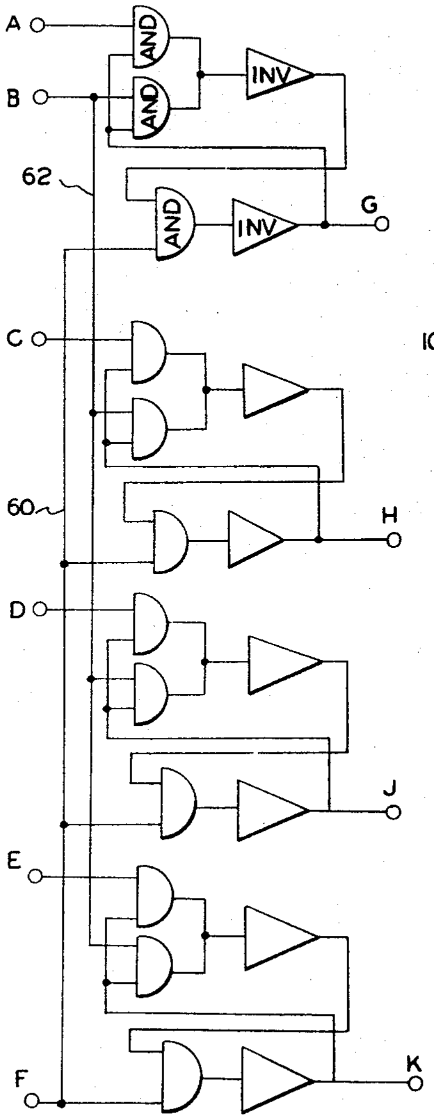
FIG. 9 is a logic diagram of a subsystem formed entirely in or on the semiconductor wafer of FIG. 1.

Referring back to FIG. 1, it will now be appreciated that the semiconductor wafer 10 contains a large number of functional elements at one face thereof, each element being exactly like the others and each containing five terminals or lands representing its inputs, output and power supply input. It is desired to produce a logic system or subsystem as illustrated in FIG. 9, this subsystem containing four of the sixteen functional elements 11–26 appropriately interconnected. The first step in this procedure is to test the wafer of FIG. 1 to determine which of the functional elements are good or which meet certain electrical requirements. This testing step is accomplished by engaging each functional element in turn with a five point probe arrangement, three of the probes having input signals applied thereto and engaging the lands A, B and X, one probe having a positive supply voltage thereon and engaging the land V, and the remaining probe detecting the output voltage at the land G, it being assumed that the substrate or wafer 10 is grounded. The probes may be positioned relative to one another with a jig which is adjusted with the aid of a microscope to bring the fine pointed wires or probes to bear upon the appropriate set of lands on the wafer. The probes may be arranged by means of an indexing mechanism to step from one functional element to the next. While the probes are in engagement with each functional element, the output voltage detected for various combinations of input signals, and other parameters are measured such as current drain, input-output impedances, etc., so that for each element an ultimate decision is reached of good or bad, go or no-go. The results of such testing are determined by observing meters or curve tracers. If the devices are being processed essentially by hand, it would be appropriate at the point to have an inking unit combined with the probe arrangement to place a dot on elements determined to be bad. Preferably, however, the testing equipment is integrally connected with a card punch mechanism or other data processing equipment which serves to store the test results correlated with the locations of the elements for subsequent use in manufacturing a mask to create the interconnection pattern.

Figure 10:
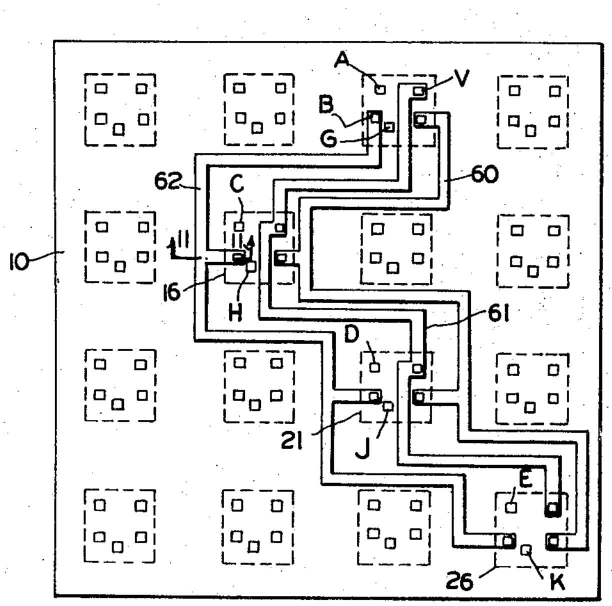
FIG. 10 is a plan view of the semiconductor wafer of FIG. 1 with a unique wiring pattern defined thereon in accordance with this invention.

Upon testing, it will be assumed for example that the functional elements 13, 16, 21 and 26 are found to be good or to have the desired electrical characteristics. This determination may be arrived at by merely observing the wafer if the inking technique was used, or by suitably programming the data processing equipment to search the stored data for this purpose. In either event the next step is to create a mask for making the necessary interconnection pattern which will connect the elements 13, 16, 21 and 26 into the system of FIG. 9. The ultimate pattern desired is seen in FIG. 10, where a metal strip 60 interconnects all of the "X" lands, a strip 61 all of the "V" lands, and a strip 62 interconnects all of the "B" lands on these four functional elements. If different elements tested good, the necessary conductive pattern would of course be different.

Figure 11:
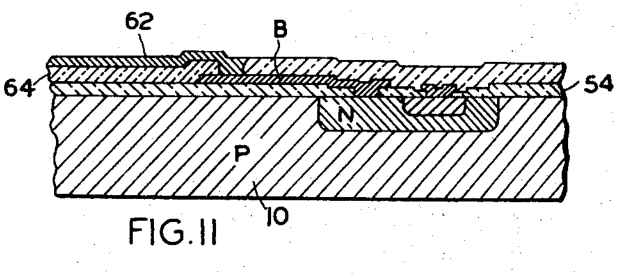
FIG. 11 is a sectional view of the wafer of FIG. 10, taken along the line 11—11, showing the multiple layers of interconnections.

Recognizing that each element includes the circuit components and interconnection strips as in FIG. 4, it is seen that the interconnection pattern of FIG. 10 overlies some of the metal pattern with the functional elements. For this reason, and also due to the fact that the interconnections between elements are preferably made in an operation separate from that which forms the intraconnections within an element, the pattern of FIG. 10 is formed as a second level of metal strips separated from the first level by a layer of insulating material. This arrangement is illustrated in FIG. 11 where a portion of the strip 62 is seen at the point where it engages the land B of the functional element 16. The second level of interconnections, including the strip 62, is insulated from the first level, exemplified by the land B, by a coating 64 except in the areas above the lands where contact must be made. This coating 64 may comprise glass which is selectively applied by mixing glass frit with a photoresist polymer, applying as a slurry to the wafer, exposing, developing, and firing the remaining glass. Also, the coating 64 may comprise hardened photoresist material itself, or may be a thick layer of silicon oxide deposited by pyrolytic decomposition of a silicon and oxygen containing compound. The coating 64 may be applied to the wafer face either before or after the testing step as described above.

With the suitably apertured insulating coating 64 in place, the entire top surface of the wafer is coated with a thin metal film, aluminum for example, and then photoresist is applied over the metal film. The mask mentioned above is now used to expose the photoresist to create the pattern of FIG. 10. The form of the desired pattern will of course depend upon the results of the electrical testing step, and since the probability of ever arriving at the exact same desired pattern twice is very small if the member of functional elements is large, this mask to be generated is referred to as a unique mask. Various methods may be used to generate the unique mask, the simplest being the conventional technique of drawing the desired pattern by hand then photographically reducing the pattern to the small size necessary to expose the photoresist. Alternatively, if the electrical test equipment is coupled to data processing apparatus as mentioned above, the apparatus may be programmed to generate the X–Y coordinates of points on the desired pattern based on stored test results, then such information used in conjunction with numerically-controlled drafting machinery to draw the desired pattern in large scale. As before, the pattern is reduced photographically to produce the unique mask. Also, a mechanically deflected light beam may be used to expose photoresist on the wafer, or to expose a photo pattern for reduction. A more attractive alternative would be to use the X–Y coordinate information generated in the data processing equipment to control the deflection plates of an electron gun which is used to produce an electron beam for exposing a photographic film in the desired pattern. This film, exposed by the electron beam, may itself be used as the mask if resolution of the beam is fine enough, or the film may be readily reduced. Perhaps the preferred method of making the unique mask, however, is to use the electron beam, controlled by X–Y coordinate information as before, to expose the photoresist on the wafer itself. The beam would scan the wafer 10 in a fixed pattern such as TV-type raster, and would be intensity modulated by coordinate information to expose the photoresist in the configuration illustrated in FIG. 10.

After exposure of the photoresist, it is developed, and the excess metal film is removed by etching. The device is now completed except for packaging. The latter is accomplished by securing the wafer onto a metallized pad on a ceramic base, then bonding fine wires to the terminals or lands A through K. These wires would be connected to posts leading through the ceramic base plate. A cap member hermetically sealed to the base completes the package.

It will be noted that the illustrative device of FIG. 10 can be constructed even though the yield of good functional elements on the wafer 10 is only 25 percent. Also, on wafers for which the yield is even lower than this, a less complex logic system could be constructed. Thus, the data processing equipment could be programmed such that if only three or two functional elements test good a pattern is generated to interconnect these good units to form a less complex logic system for other uses.

In the embodiment described above, two levels of interconnections are made, the first being between components and the second between functional elements. Instead, all of the interconnections can be made on one level by utilizing cross-over tunnels just as in FIG. 8. A large number of these tunnels would be formed in the spaces on the wafer between the functional elements, and these would be used whenever two conductive strips would otherwise intersect. Only one metallization step would be necessary here, but this means that the components would not be interconnected to form the functional elements at the time of testing, requiring that testing be done on the component level rather than the functional element level. While more tedious, this could be done.

As described thus far, the testing and discretionary interconnection is done on the basis of the functional elements each of which includes the parts seen in FIGS. 2–4. It will be understood of course that this discretionary interconnection step could be done on a lower level of complexity, such on the basis of the individual gates and inverters in the logic system, or on higher levels of complexity. Furthermore, several such discretionary interconnection steps could be utilized, starting with selection of good components, then good circuits, then functional elements, then logic subsystems. Several levels of interconnecting patterns might be required, in which case the principles of FIG. 11 could be continued, adding a layer of insulating material and a layer of conductive strips for each interconnection level.

While the invention has been described with reference to illustrative embodiments, it is understood that this description is not to be construed in a limiting sense. Other embodiments of the inventive concept, as well as modifications of the disclosed embodiments, will appear to persons skilled in the art. It is thus contemplated that the appended claims will cover any such embodiments or modifications as fall within the true scope of the invention.

What is claimed is:

1. A method of making an electronic system of the type containing a large number of functional elements, with each such element including a plurality of electronic components, comprising the steps of: forming a large number of electronic components adjacent one face of a wafer of semiconductor material, the wafer having a coating of insulating material on said face with openings defined in the coating for making contacts to the electonic components, providing a pattern of conductive strips over said insulating coating and extending into said openings to connect groups of said electronic components together to provide a plurality of functional elements, the number of such elements exceeding the number needed to form said electronic system, applying a second coating of insulating material on said face of the wafer over the pattern of conductive strips, such second coating defining openings at selected areas for making contact to said functional elements, testing the electronic functional elements to determine the locations on said wafer of selected functional elements which have preferred electrical characteristics, and forming a pattern of conductive strips over said second coating to interconnect a plurality of said selected functional elements to provide said electronic system, the configuration of said pattern being correlated with said locations of the selected elements.

2. A method of making an electrical system comprising the steps of forming a large number of electrical components adjacent one face of a substrate, the substrate having a coating of insulating material on said face with openings defined in the coating for making contacts to the electronic components, providing a pattern of conductive strips over said insulating coating and extending into said openings to connect groups of said electronic components together to provide a plurality of functional elements, applying a second coating of insulating material on said face of the substrate over the pattern of conductive strips, such second coating defining openings at selected areas for making contact to said functional elements, testing the electronic functional elements to determine the locations on said substrate of selected functional elements having preferred electrical characteristics, and interconnecting the selected functional elements on said substrate by a unique pattern of conductive strips applied over said second coating, the unique pattern being determined by the results of said testing.

3. A method of making an electronic system according to claim 1, wherein said step of testing is performed before said step of applying.

4. A method according to claim 2, wherein said step of testing is performed before said step of applying.

5. In a method of making complex electronic circuitry of the type containing a plurality of functional elements, with each such element including a plurality of electronic components, the steps of: providing a large number of electronic components at one face of a substrate, the substrate having a coating of insulating material over at least the major portion of said face with contact areas for making contacts to the electronic components being exposed, providing a first pattern of conductive strips on said one face extending along said insulating coating and extending onto said contact areas to connect groups of said electronic components together to provide a plurality of functional elements, the number of such elements exceeding the number needed to form said electronic system, the first pattern also providing contact areas for the functional elements, testing the functional elements to determine the locations on said substrate of selected functional elements which have preferred electrical characteristics, generating a unique pattern corresponding to conductors for interconnecting said selected functional elements to provide the desired complex circuitry, said unique pattern being generated from the test results, and defining on said one face according to said unique pattern a second pattern of conductive strips to interconnect a plurality of said selected functional elements, the second pattern of conductive strips making electrical connections to selected ones of said contact areas and being otherwise electrically insulated from said first pattern.

6. A method according to claim 5, wherein said second pattern is defined on said one face by depositing a film of metal on said one face, applying photoresist material over said film, exposing the photoresist according to a said unique pattern and developing the photoresist to provide an etch-resistant mask, then etching away portions of the film of metal not covered by the mask.

7. A method according to claim 6 wherein the photoresist material is exposed by means of an electron beam which is indexed in a pattern corresponding to said unique pattern.

8. A method according to claim 6 wherein the photoresist material is exposed to light through a mask corresponding to said unique pattern, such mask being generated using the test results.

9. A method according to claim 8 wherein the mask is generated by exposure of photosensitive material to a beam of light which is indexed in accordance with the test results.

10. A method of manufacturing a complex electronic system having a plurality of circuit functions therein, each circuit function having a plurality of electronic components comprising the step of: forming a large number of electronic components at one face of a semiconductor substrate with an insulating layer on said one face having openings therein exposing contact areas on said electronic components, applying a first pattern of conductive strips on said insulating layer extending into said openings to interconnect groups of said electronic components so that the groups provide a plurality of separated circuit functions exceeding in number that required for said electronic system, testing said electronic components and storing the test results correlated with the locations of particular circuit functions having preferred electrical characteristics, generating representation of an interconnection pattern in response to the stored test results and thereafter applying a second pattern of conductive strips over said one face of said substrate in accordance with said representation of the interconnection pattern to interconnect said particular circuit functions less than the total number of circuit functions and form said electronic system.

11. A method according to claim 10, wherein said step of applying a second pattern of conductive strips comprises applying a second insulating layer over said first pattern of conductive strips with apertures therein exposing contact areas on said particular circuit functions and said second pattern of conductive strips are applied on said second insulating layer.

12. A method according to claim 10, wherein said second pattern of conductive strips is applied on said insulating layer.

13. A method according to claim 11, wherein said step of applying said second pattern of conductive strips comprises applying a conductive coating over the entire surface of said second insulating layer, forming the desired exposure pattern on said photoresist layer by a beam of energy which is directed along said one face in accordance with said representation of an interconnection pattern, removing selected portions of said photoresist layer to expose undesired portions of said conductive material and removing the exposed undesired portions of said conductive material to leave said second pattern of conductive strips.

14. A method according to claim 10, wherein said step of testing said electronic components comprises testing each group of electronic components comprising a circuit function.

15. A method according to claim 5, including the step of storing the test results correlated with said locations.

16. A method according to claim 5, wherein said step of testing the functional elements comprises testing groups of said functional elements.

17. A method according to claim 5, wherein said second pattern is applied over an insulating layer applied over said insulating coating.

18. A method of manufacturing a complex electronic system having a plurality of circuit functions therein, each circuit function having active and passive electronic components comprising the steps of: forming a large number of said electronic components at least partially in said one face of a semiconductor substrate with a first insulating layer on said one face having openings therein exposing contact areas on said electronic components, applying a first conductive pattern on said insulating layer in ohmic contact with selected ones of said electronic components through said openings to connect groups of said electronic components together to provide said plurality of circuit functions, arranging said circuit functions in a matrix of rows and columns on said one face of said substrate with spaces between said rows, applying a second insulating layer over said first conductive pattern with openings therein exposing contact areas on said first conductive pattern so that said circuit functions can be interconnected, applying a second conductive pattern on said second insulating layer in ohmic connection with the exposed portions of said first conductive pattern to interconnect said circuit functions and form said electronic system, and winding at least on conductor from said second conductive pattern along the spaces between said rows and to interconnect a terminal in a circuit function located in each row and a plurality of columns.

19. A method according to claim 18, wherein said step of applying said second conductive pattern comprises: applying conductive material over the entire surface of said second insulating layer, applying a photoresist layer over said conductive material, selectively exposing said photoresist material with a beam of energy which is directed along said one face of said substrate to form a desired exposure pattern on said photoresist material, developing the photoresist material to provide an etch resistant mask thereby exposing undesired portions of said conductive material, and removing said undesired portions of said conductive material to leave the desired second conductive pattern.

20. A method according to claim 18, wherein all of said circuit functions are identical and each group comprises a like number and kind of electronic components.

* * * * *